(12) United States Patent
Yang et al.

(10) Patent No.: US 6,734,080 B1
(45) Date of Patent: May 11, 2004

(54) SEMICONDUCTOR ISOLATION MATERIAL DEPOSITION SYSTEM AND METHOD

(75) Inventors: Nian Yang, San Jose, CA (US); John Jianshi Wang, San Jose, CA (US); Tien-Chun Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/159,078

(22) Filed: May 31, 2002

(51) Int. Cl.$^7$ ................................................ H01L 21/76
(52) U.S. Cl. ........................ 438/427; 438/400; 438/424
(58) Field of Search ................ 438/400, 424, 438/427

(56) References Cited

U.S. PATENT DOCUMENTS

| | | | |
|---|---|---|---|
| 5,459,096 A | * 10/1995 | Venkatesan et al. | 438/437 |
| 5,498,565 A | * 3/1996 | Gocho et al. | 438/427 |
| 5,604,149 A | * 2/1997 | Paoli et al. | 438/437 |
| 5,851,899 A | * 12/1998 | Weigand | 438/427 |
| 5,911,110 A | * 6/1999 | Yu | 438/424 |
| 5,923,993 A | * 7/1999 | Sahota | 438/427 |
| 5,943,590 A | * 8/1999 | Wang et al. | 438/427 |
| 6,043,133 A | * 3/2000 | Jang et al. | 438/401 |
| 6,083,796 A | * 7/2000 | Park et al. | 438/294 |
| 6,090,713 A | * 7/2000 | Karlsson et al. | 438/691 |
| 6,093,656 A | * 7/2000 | Lin | 438/734 |
| 6,171,896 B1 | * 1/2001 | Jang et al. | 438/221 |
| 6,194,285 B1 | * 2/2001 | Lin et al. | 438/424 |
| 6,251,783 B1 | * 6/2001 | Yew et al. | 438/692 |
| 6,261,923 B1 | * 7/2001 | Kuo et al. | 438/427 |
| 6,303,460 B1 | * 10/2001 | Iwamatsu | 438/401 |
| 6,326,309 B2 | * 12/2001 | Hatanaka et al. | 438/693 |
| 6,436,789 B2 | * 8/2002 | Sawamura | 438/424 |
| 6,475,865 B1 | * 11/2002 | Yang et al. | 438/270 |
| 6,486,040 B2 | * 11/2002 | Chen et al. | 438/427 |

* cited by examiner

*Primary Examiner*—Long Pham

(57) ABSTRACT

A semiconductor isolation material deposition system and method that facilitates convenient and efficient integrated multi-step deposition of isolation regions is presented. In one embodiment of the present invention, an integrated circuit includes densely configured component areas and sparsely configured component areas. An active area in a wafer is created and a shallow trench space is formed. A thin layer of TEOS isolation material layer is deposited on top of the active area and the shallow trench. For example, the layer of thin layer of TEOS isolation material is in a range of 4000 to 5000 angstroms thick over the top of underlying active areas. A reverse mask and pre-planarization etch is performed on the thin layer of TEOS isolation material. The remaining TEOS edge spikes between the densely configured component area and the sparsely configured component area are minimal (e.g., about 500 angstroms. The remaining excess oxidant and silicon nitride are removed utilizing chemical mechanical polishing processes. In one exemplary implementation, the present invention facilitates an integrated approach to STI fabrication processes that achieve successful high yielding results by considering the impacts of one process step on another.

20 Claims, 4 Drawing Sheets

100

```
Forming a component layer on a wafer.
110
         │
         ▼
Developing isolation regions between components of
the component layer.
120
         │
         ▼
Depositing a thin layer of isolation material on top of
the component layer and the isolation regions.
130
         │
         ▼
Removing excess isolation material covering the
component layer and the isolation regions.
140
```

```
Creating an active area in a wafer.
310
          │
          ▼
Forming a shallow trench space in the wafer.
320
          │
          ▼
Depositing a thin layer of TEOS isolation material on
top of the active area and the shallow trench.
330
          │
          ▼
Performing a reverse mask and pre-planarization etch
on the thin layer of TEOS isolation material.
340
          │
          ▼
Removing excess TEOS isolation material utilizing a
CMP process.
350
```

FIG. 3

SEMICONDUCTOR ISOLATION MATERIAL DEPOSITION SYSTEM AND METHOD

FIELD OF THE INVENTION

The present invention relates to the field of integrated circuit design and semiconductor chip fabrication. More particularly, the present invention relates to an efficient and effective system and method for depositing tetraethylorthosilicate on a wafer.

BACKGROUND OF THE INVENTION

Electronic systems and circuits have made a significant contribution towards the advancement of modern society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results include integrated circuits. Integrated circuit fabrication usually involves multi-step processes that attempt to produce precise components that operate properly. Many integrated circuit processes involve repeated deposition and removal of material layers to fabricate components and it is often very difficult to achieve optimized results within requisite narrow tolerances. Inadequate removal of some material layers can have detrimental impacts on the performance of the final product.

Semiconductor integrated circuit manufacturing efforts are usually complicated by ever increasing demands for greater functionality. More complicated circuits are usually required to satisfy the demand for greater functionality. For example, there is usually a proportional relationship between the number of components included in an integrated circuit and the functionality, integrated circuits with more components typically provide greater functionality. However, including more components within an integrated circuit often requires the components to be densely packed in relatively small areas and reliably packing a lot of components in relatively small areas of an IC is usually very difficult.

One traditional focus for achieving greater densities has been directed towards reducing the size of isolation regions around individual components (e.g., transistors). The components of an integrated circuit are usually fabricated on a single silicon substrate and maintaining both the integrity of the system as a whole as well as the individual basic device characteristics is very important for proper operation. Proper isolation is very helpful in achieving these objectives and without proper device isolation there is a tendency for detrimental interactions to occur. For example, placement of more components in smaller spaces by reducing the separation between adjacent components increases the probabilities of failures associated with parasitic conduction paths and latch up. Proper isolation significantly reduces the probability of parasitic conduction and latch up. Thus, it is important for integrated circuit fabrication technologies to provide an advantageous balance between isolation integrity and increased component density.

Shallow trench isolation (STI) in an integrated circuit fabrication technology that usually offers significant potential for maintaining isolation integrity and increasing component density. STI offers many advantages over other methods, such as local oxidation of silicon (LOCOS), since STI has minimal field encroachment, good latch-up immunity, smooth planarity, and reduced junction capacitance. It is important for basic device characteristics to be as close to ideal as possible and STI helps by reducing parasitic conduction paths and series resistances, maintaining threshold voltage control, and minimizing the leakage current of the device.

STI usually consists of a trench filled with an isolation material such as oxide. It is important for oxide layers to be accurately applied to ensure proper isolation without defects. It is also desirable for the oxide application to be efficient and low cost. Deposition of high quality oxide film with the ability to fill very narrow gaps uniformly across a wafer can be challenging. Tetraethylorthosilicate (TEOS) deposition provides many advantages that facilitates the pursuit of these objectives. One advantage of TEOS is its ability to conform to underlying topography. TOES is usually applied in a liquid form and has characteristics that enable it to accurately fill small and large trenches. However, TEOS techniques also usually results in oxide overfill that needs to be removed in order for the device to work correctly. Thus, STI techniques also typically involve material removal steps that tend to increase the fabrication complexity.

Traditional STI excess isolation material removal processes usually involves numerous technical and economic challenges due to adverse impacts associated with earlier process steps. Material removal processes such as chemical mechanical polishing (CMP) typically encounter problems that make it difficult to achieve accurate material removal and planarization in STI applications. For example, the amount of material removed during a chemical mechanical polishing (CMP) process usually depends upon the component pattern density of an active area formed in earlier process steps. Differences in density typically cause uneven polishing within a die and across a wafer often resulting in excessive and/or insufficient removal in some areas. Some manufacturers attempt partial removal of excess insulating material in densely configured areas to compensate for the adverse impacts on STI CMP due to changes in component density in different areas of a semiconductor wafer. However, these activities usually introduce additional complications for a STI CMP process. For example, the partial removal of excess insulating material in some areas usually results in significant and abrupt topographical differences between the areas.

One common detrimental topographical impact that occurs when manufactures attempt traditional partial material removal approaches to addressing component density impacts on CMP is the creation of significant spikes. The significant spikes are often in excess of 5000 Angstroms tall. While CMP is often efficient at removing excess material and planarizing the wafer to provide a smooth surface, significant and abrupt spikes that occur in traditional systems usually significantly impact CMP processes. The spikes result in uneven polishing and make it difficult to gauge the rate at which the excess insulating material (e.g., TEOS) is being removed during polishing. For example, spike height differences of excess oxide between large and small source/drain active areas make it difficult to adequately polish the overfill oxide on top of the small dimension active region without excessively polishing the large source/ drain active areas. However, leaving overfill oxide over the small source/drain active regions further complicates the manufacturing processes by increasing the difficulty of removing the protective silicon nitride layer, resulting in a residual silicon nitride problem. Inadequate oxide removal makes removal of the sacrificial nitride layer extremely difficult, thus neutralizing the active area. The residual silicon nitride problem can result in significant yield degradation. Attempts to address the problem by brute force polishing efforts can easily result in over polishing. Over polishing leads to excessive nitride erosion and trench oxide neutralizing the active area. Therefore the ability to precisely remove excess insulating STI oxide in convenient and efficient manner is very important.

SUMMARY OF THE INVENTION

A semiconductor isolation material deposition system and method that facilitates convenient and efficient integrated multi-step deposition of isolation regions is presented. In one embodiment of the present invention, an integrated circuit includes densely configured component areas and sparsely configured component areas. An active area in a wafer is created and a shallow trench space is formed. A thin layer of TEOS isolation material layer is deposited on top of the active area and the shallow trench. For example, the layer of thin layer of TEOS isolation material is in a range of 4000 to 5000 angstroms thick over the top of underlying active areas. A reverse mask and pre-planarization etch is performed on the thin layer of TEOS isolation material. The remaining TEOS edge spikes between the densely configured component area and the sparsely configured component area are minimal (e.g., about 500 angstroms. The remaining excess oxidant and silicon nitride are removed utilizing chemical mechanical polishing processes. In one exemplary implementation, the present invention facilitates an integrated approach to STI fabrication processes that achieve successful high yielding results by considering the impacts of one process step on another.

BRIEF DESCRIPTION OF THE DRAWINGS

FIG. 1 is a flow chart of semiconductor fabrication method 100, one embodiment of a semiconductor fabrication method in accordance with the present invention.

FIG. 3 is a flow chart of a thin TEOS deposition process in accordance with one embodiment of the present invention.

DETAILED DESCRIPTION OF THE INVENTION

Figure 2A:
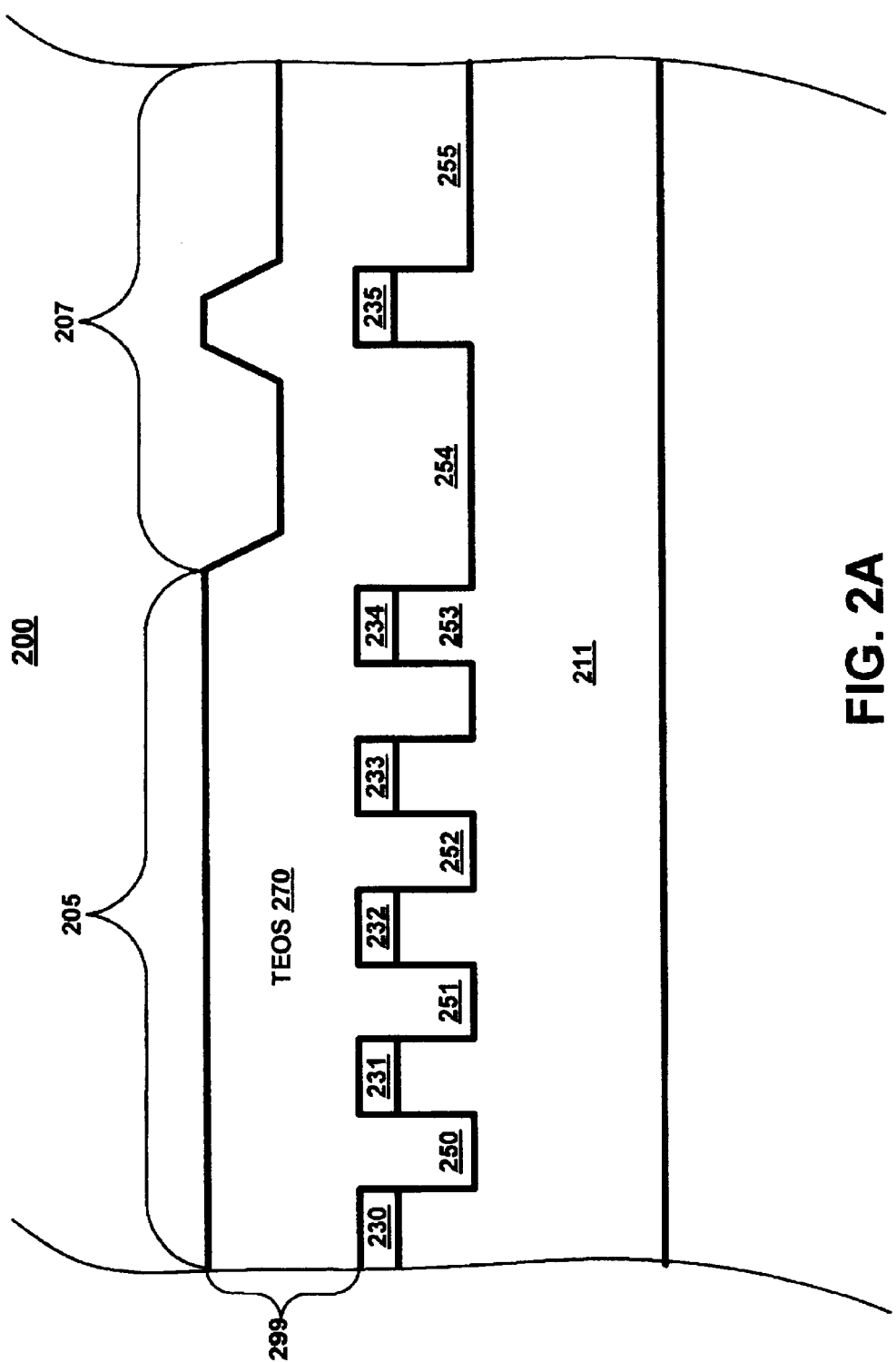
FIG. 2A is an illustration of thin TEOS layer integrated circuit in accordance with one embodiment of the present invention.

Reference will now be made in detail to the preferred embodiments of the invention, a semiconductor isolation material deposition system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The system and method of the present invention provides convenient and efficient semiconductor isolation material deposition. The semiconductor isolation material deposition system and method facilitates shallow trench isolation barrier formation in an integrated circuit chip while maintaining relatively planar surfaces. In one embodiment Tetraclthylorthosilicate (TEOS) is utilized fill the shallow trench with minimal excess overfill requiring removal. The minimization of the excess overfill facilitates partial removal of the excess overfill above dense component area without excessive detrimental effects associated with topographical ridges (e.g., spikes) between density areas. The reduction of topographical ridges between etching areas facilitates even and efficient chemical mechanical polishing (CMP) of a wafer.

FIG. 1 is a flow chart of semiconductor fabrication method 100, one embodiment of a semiconductor fabrication method in accordance with the present invention. In one embodiment semiconductor fabrication method 100 is utilized to fabricate a variety of integrated circuit components (e.g., flash memory cell arrays, voltage rails, etc.). Semiconductor fabrication method 100 facilitates deposition of isolation material (e.g., TEOS) to isolate the components in a manner that is compatible with integrated fabrication process steps and minimizes the probability that excess isolation material overfill will have detrimental impacts on subsequent process steps and or final yield. In step 110, a component layer is formed on a wafer. In one embodiment of the present invention, the component layer includes a source drain active region. The component layer may include a variety components (e.g., transistors, flash memory cells, etc.). In one embodiment of the present invention, forming the component layer includes oxidizing a wafer to form a thin pad oxide layer of silicon dioxide and performing a low pressure chemical vapor deposition (LPCVD) process to form a silicon nitride layer which servers as an implantation mask and an oxidation mask.

In one embodiment of the present invention, the component area includes a densely configured active component area and a sparsely configured active component area. In one exemplary implementation, the densely configured active component area is a core area and the sparsely configured active component area is a peripheral area. For example, a densely configured core area may include an array of flash memory cells and the sparsely configured peripheral area may include a transistor or power line.

Isolation regions are developed between components of the component layer in step 120. In one embodiment of the present invention, the isolation region includes a shallow trench isolation region. In one exemplary implementation, the shallow trench isolation region development includes defining a trench etch area utilizing a lithography process, etching a trench in the silicon underlying the defined trench etch area, and passivating the surface of the trench with thermally grown oxide. For example, lo fabricate the isolation trenches the wafer is coated with a photoresist, exposed to the desired trench isolation pattern and the exposed photoresist is developed away. Silicon nitride in the open areas is plasma etched away and then the silicon oxide under the open areas is also etched away stopping on the silicon semi-conducting material. Then the silicon semi-conducting material below the openings in the silicon oxide and silicon nitride is plasma etched to form a shallow trench.

At step 130, a thin layer of isolation material is deposited on top of the component layer and the isolation regions. The thin layer of isolation material is confined to a thickness that will not introduce significant spikes in later process steps. In one exemplary implementation, the applied TEOS layer is in a range of about 3500 to 5500 angstroms thick over the top of underlying active areas (e.g., above a top silicon nitride layer). In one embodiment of the present invention, the thin layer of isolation material is tetraethylorthosilicate (TEOS) liquid deposited by a low pressure chemical vapor deposition (LPCVD) process.

Figure 2B:
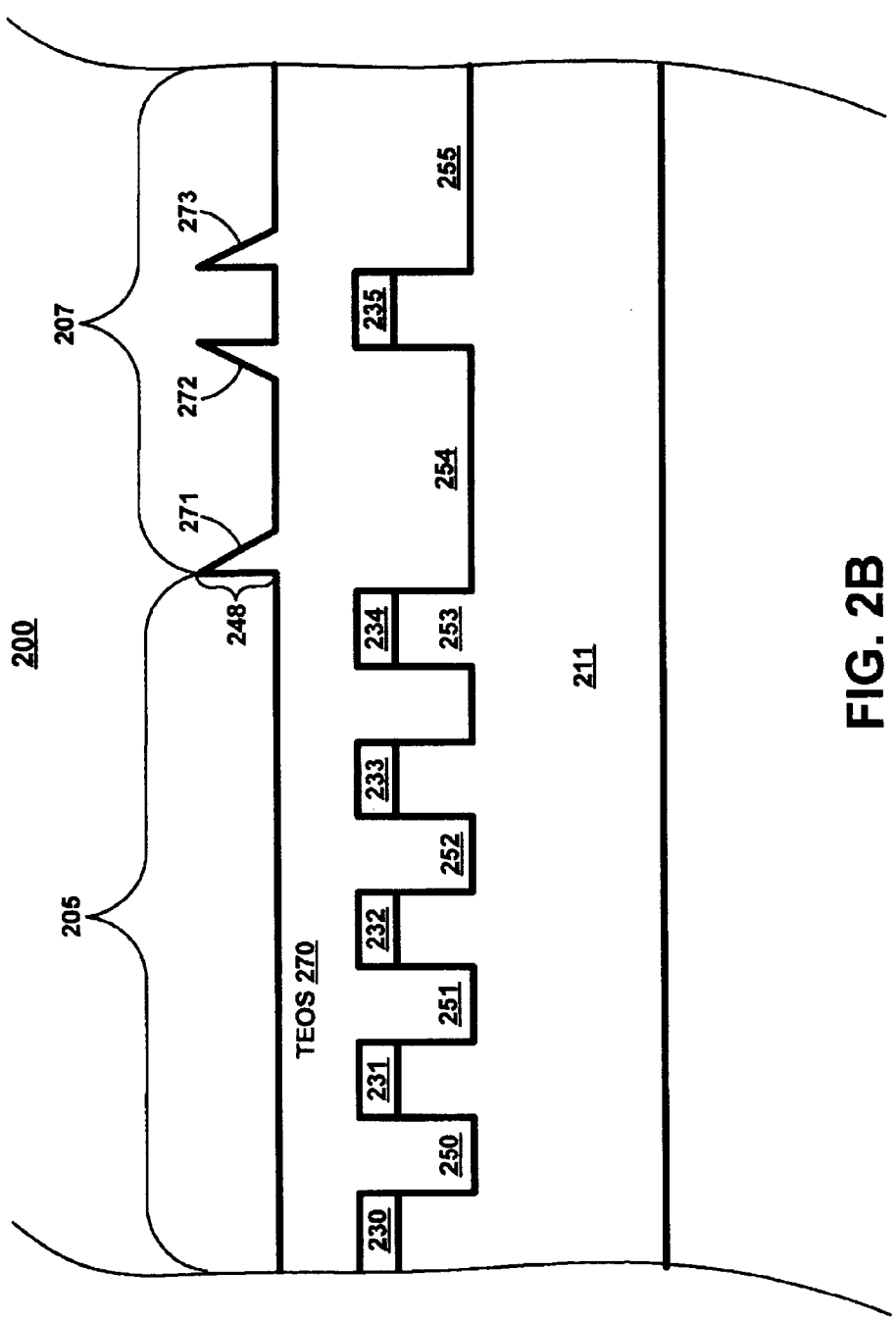
FIG. 2B is an illustration of one embodiment of the topography of a wafer after excess overfill TEOS is partially removed.

In step 140, excess isolation material covering the components and the isolation regions are removed. In one embodiment of the present invention, a component density compensating excess oxidant removal process is performed on densely configured active component areas. The component density compensating excess oxidant removal process removes a portion of excess oxide over the densely configured active component area. For example, a reverse mask and pre-planarization etch is performed on the thin layer of isolation material (e.g., TEOS). In one embodiment, removing excess isolation material includes utilizing a chemical mechanical polishing process to remove excess oxidant from above the densely configured active component area and the sparsely configured active component area. The chemical mechanical polishing process also removes excess silicon nitride from above the densely configured active component area and the sparsely configured active component area in one exemplary implementation. FIG. 2A is an illustration of thin TEOS layer integrated circuit 200, one embodiment of isolation material deposition-in accordance with the present invention. Integrated circuit 200 comprises silicon semiconductor material 211, core active components (e.g., flash memory cells) 230 through 234 in densely configured component area 205, periphery component (e.g. conducting line) 235 in sparsely configured component area 207, core shallow trench isolation barriers 250 through 253, periphery shallow trench isolation barriers 254 and 255, and thin TEOS layer 221. Shallow trench isolation barriers 250 through 255 isolate core active components 230 through 234 and periphery component 235 from each other. TEOS is deposited in a layer with a thickness 399 (e.g., in the range of about 4000 to 5050 angstroms thick) over the top of underlying active areas. FIG. 2B is an illustration of the topography of the wafer after excess overfill TEOS is partially removed (e.g., by a reverse mask and pre-etch process). The small spikes 271, 272 and 273 of remaining excess isolation TEOS material have relatively small height 248 (e.g., 2000 to 3000 Angstroms) which are easy to polish (e.g., with a CMP process).

In one embodiment, the components of integrated circuit 200 including core active components (e.g., flash memory cell) 230 through 234, periphery component (e.g. conducting line) 235, core shallow trench isolation barriers 250 through 253 and periphery shallow trench isolation barriers 254 and 255, are fabricated by utilizing lithographic processes. For example, a shallow trench is developed and is filled with oxide as part of the TEOS deposition process. In one embodiment, a multistep plasma etch is utilized to partially remove the oxide and nitride from active device above core area. For example a typical oxide removal etch step comprises Ar, CF4, CHF3, CO, and/or C4F8.

FIG. 3 is a flow chart of thin TEOS integrated circuit chip fabrication process 300, one embodiment of the present invention. In one embodiment, thin TEOS integrated circuit chip fabrication process 300 enables a shallow trench isolation barrier to be efficiently included in a semiconductor chip. Thin TEOS deposition process 300 facilitates reduction of detrimental impacts of isolation material deposition on subsequent process steps, including reduction of excessively large excess overfill ridges (e.g., at the edges of differing density active areas).

In step 310, an active area is created in a wafer. In one embodiment, a layer of a silicon oxide is deposited on the wafer followed by a layer of silicon nitride on top of the oxide. In one exemplary implementation, the active area includes a variety of components (e.g., transistors, flash memory cells, etc.). An active area includes a dense component portion and a sparse component portion in one embodiment of the present invention.

A shallow trench space is formed in the wafer in step 320. For example, a lithographic process is utilized in which a shallow trench is formed on a wafer made of semiconducting material such as silicon (Si). In one embodiment of the present invention, a resistive mask pattern is created over the wafer. The resist material is used to mask or protect one area of the wafer while working on another. In one embodiment the mask is imprinted utilizing a lithography. For example, in a photomasking process a photo resist or light-sensitive film is applied to the wafer, giving it characteristics similar to a piece of photographic paper. A photo aligner aligns the wafer to a mask and then projects an intense light through the mask and through a series of reducing lenses, thereby exposing the photo resist to light according to the mask pattern. The portions of the resist exposed to light becomes soft or hard depending on the photo resist used. The soft resist is washed away and nitride in the open areas is plasma etched away, followed by the oxide under the open areas stopping on the silicon. Then the underlying silicon below the openings in the oxide and nitride is plasma etched to create or form a shallow trench space. In one embodiment, the etching is accomplished by exposing the silicon to a chemical solution or plasma gas discharge (e.g., Ar, CF4, CHF3, CO, and/or C4F8).

In step 330, a TEOS deposition material is deposited in a thin layer over the developed areas. In one embodiment of the present invention the thin TEOS layer is in a range of 4000 to 5000 angstroms thick over the top of underlying active areas. The TEOS material is spread over the top of the remaining semiconducting material in a manner that causes the isolation material to fill the developed areas (e.g., the shallow trench space). For example, TEOS deposition material is deposited in a thin layer over an etched shallow trench space to form a shallow trench isolation barrier.

After the developed areas (e.g., a shallow trench space) are full of isolation material, excess isolation material overfill is partially removed at step 340 by a reverse photomask and pre-planarization etch. In one embodiment of the present invention, a reverse photomask and etch pre-planarization technique is applied to the thin TEOS layer to facilitate compensation for pattern density affects on material removal polishing processes. This technique reverses the STI photomask image, exposing and subsequently etching oxide over the nitride active areas. The reverse photomask and etch pre-planarization technique facilitates removal of excess oxide over very dense or large active areas and minimization of the probability of too much polishing of excess oxide over the lower density component areas or isolated small active structures.

In one embodiment, the reverse photo mask and pre-planarization etch process is utilized in one embodiment to remove a portion of the excess material from dense active areas. In one exemplary implementation, a photo lithography process is used in which a photoresist material is placed on top a nitride stop layer (e.g., a nitride layer deposited in step 310). The photoresist is exposed to a first light pattern projected by a first mask. The exposure to light causes the photoresist to harden or soften in the expose areas. The soften areas are washed away and an etching process is performed. The thin TEOS is then deposited over the wafer including filling in the etched formations and leaving a thin excess overfill. Due to density impacts on the excess removal process, a reverse photo etch process is utilized to remove excess oxide from the dense active areas. The wafer is again covered with a photoresist material and is exposed to a second light pattern projected by a second mask. The second pattern causes light to strike surface areas of the wafer that were dark in the first pattern and prevents light form striking areas of the wafer that were lighted by the first pattern. Thus, areas of the wafer surface that were hardened by the first patterned are softened by the second pattern, and vice versa. The soften areas are washed away and an etching process is performed in which excess overfill oxide material is partially removed from areas over densely configured active components. step 350, excess TEOS isolation material overfill is removed by a chemical mechanical polishing (CMP) process. In one embodiment of the present invention, a CMP process utilizes abrasive contact and chemical interactions to remove excess material. A wafer and a polishing pad are forced into an abrasive contact with one another and a portion of a excess oxide is removed. In one exemplary implementation, the CMP process utilizes a slurry that comprises a chemical reaction component and an abrasive frictional component. She slurry is usually applied to the polishing pad and transported to the surface of the wafer by the pad. The constituents of the slurry are precisely determined and controlled in order to effect optimized CMP material removal and planarization. The chemical reaction component is attributable to polishing agents which chemically interact with the material on the wafer. The polishing agents soften and/or dissolve the surface material of the wafer layer to be polished by chemically reacting with it. The abrasive frictional component includes abrasive particles suspended in the slurry. The abrasive particles add to the abrasive characteristics of the polishing pad as it exerts frictional contact with the surface of the wafer. Together the abrasive frictional component and a chemical reaction component assist a polishing pad to remove material from the surface of the wafer.

The friction caused by the contact between the rotating polishing pad and the rotating g wafer in conjunction with the abrasive and chemical characteristics of the slurry, combine to remove a top portion of the wafer layer and planarize or polish the wafer at some nominal rate. This rate is referred to as the removal rate. A constant and predictable removal rate is important to the uniformity and performance of the wafer fabrication process. The present invention facilitates an expedient uniform removal rate while yielding planarized wafers free from a excessively rough surface topography. Thus portions of the wafer are not removed at a faster rate while other portions are removed at a slower rate creating a rough topography instead of a planarized one, increasing control problems and does not produce variations that impact uniformity and degrade yield. The thin ITOS deposition with minimal oxide spikes significantly reduces adverse impacts on the effectiveness of the abrasive and chemical characteristics of the process, which in turn improves control of the removal rates. The portions of the excess overfill oxide surface material over the dense active component areas that are subjected to the reverse image etch are removed at essentially the same rate as the portions of the excess overfill oxide surface material over the sparse active component areas not subjected to the reverse image etch.

Thus, a thin TEOS deposition system and method of the present invention facilitates minimization of adverse impact in multi-step integrated circuit fabrication. By utilizing both the reverse photomask and etch pre-planarization along with the CMP removal of the thin TEOS layer to provide accurate removal of excess oxide, the present invention also facilitates stripping of the sacrificial nitride layer by removing sufficient active area oxide that would otherwise potentially cause significant yield degradation. Ensuring the excess oxide is sufficiently removed from the nitride active area and simultaneously controlling the amount of over-polish during the STI polish process provides a greater probability of a high yield. The reduced occurrence of edge spikes between densely configured component areas and sparsely configured component areas facilitates removal of excess oxidant and reduction of problems associated with residual silicon nitride. The present invention is helpful in the formation of isolation trenches that provide reduced parasitic conduction paths and series resistances, maintenance of threshold voltage control, and minimized leakage current of the device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of semiconductor fabrication comprising:
   forming a component layer on a wafer;
   developing isolation regions between components of said component layer;
   depositing a thin layer isolation material on top of said component layer and said isolation regions; and
   removing excess isolation material covering said components and said isolation region, wherein excess overfill isolation material is partially removed in an etching process leaving relatively small spikes in a range of 2000 to 3000 Angstroms and the remainder of the excess isolation material is remove by a polishing process.

2. The semiconductor fabrication method of claim 1 wherein said thin layer isolation material includes a tetraethylorthosilicate (TEOS).

3. The semiconductor fabrication method of claim 2 wherein said thin TEOS layer is in a range of about 4000 to 5000 angstroms thick over the top of underlying active areas.

4. The semiconductor fabrication method of claim 1 wherein said component area includes a densely configured active component area and a sparsely configured active component area.

5. The semiconductor fabrication method of claim 3 further comprises performing a component density compensating excess oxidant removal process on said densely configured active component area.

6. The semiconductor fabrication method of claim 5 wherein said component density compensating excess oxidant removal process removes a portion of excess oxide over said densely configured active component area.

7. The semiconductor fabrication method of claim 5 further comprising utilizing a chemical mechanical polishing process to remove excess oxidant from above said densely configured active component area and said sparsely configured active component area.

8. The semiconductor fabrication method of claim 7 wherein said chemical mechanical polishing process removes a layer of excess silicon nitride from above said densely configured active component area and said sparsely configured active component area.

9. A thin isolation material deposition fabrication process comprising the steps of:

creating an active area in a wafer;

forming a shallow trench space in said wafer;

depositing a thin layer of tetraethylorthosilicate (TEOS) isolation material on top of said active area and said shallow trench;

performing a reverse mask and pre-planarization etch on said thin layer of TEOS isolation material, wherein excess overfill TEOS isolation material is partially removed leaving relatively small spikes in a range of 2000 to 3000 Angstroms; and removing excess TEOS isolation material utilizing a chemical mechanical polishing process.

10. The thin isolation material deposition fabrication process of claim 9 wherein said thin TEOS layer is in a range of about 4000 to 5000 angstroms thick over the top of said active area.

11. The thin isolation material deposition fabrication process of claim 9 wherein said active area includes a dense component portion and a sparse component portion.

12. The thin isolation material deposition fabrication process of claim 11 wherein said reverse mask and pre-planarization etch are performed on said thin layer of TEOS isolation material over said dense component portion.

13. The thin isolation material deposition fabrication process of claim 9 further comprising:

applying layers of oxide and nitride to said wafer;

creating a resistive mask material pattern on said wafer; and etching a shallow trench space.

14. The thin isolation material deposition fabrication process of claim 9 wherein said thin TEOS material is spread over the top of said wafer in a manner that causes said thin TEOS material to fill said shallow trench space.

15. The thin isolation material deposition fabrication process of claim 9 wherein said chemical mechanical polishing process removes excess oxidant above said nitride layer.

16. The thin isolation material deposition fabrication process of claim 9 wherein said chemical mechanical comprises forcing a polishing pad into abrasive contact with said wafer and applying a slurry.

17. A semiconductor isolation material deposition process comprising the steps of:

developing a densely configured component area and sparsely configured component area in a wafer;

creating a thin layer of tetraethylorthosilicate (TEOS) isolation material that is shallower over said densely configured component area than said sparsely configured component area with edge spikes that are in the range of 2000 to 3000 angstroms tall; and removing excess oxidant utilizing a chemical mechanical polishing process.

18. The semiconductor isolation material deposition process of claim 17 wherein said thin TEOS layer is in a range of about 4000 to 5000 angstroms thick over the top of said sparsely configured component area.

19. The semiconductor isolation material deposition process of claim 17 wherein creating said thin layer of TEOS includes utilizing a reverse mask and pre-planarization etch on said thin layer of TEOS over said densely configured component area.

20. The semiconductor isolation material deposition process of claim 17 wherein said chemical mechanical polishing process removes excess oxidant above said a nitride layer.

* * * * *